United States Patent
Faust et al.

(10) Patent No.: US 7,076,708 B2
(45) Date of Patent: Jul. 11, 2006

(54) METHOD AND APPARATUS FOR DIAGNOSIS AND BEHAVIOR MODIFICATION OF AN EMBEDDED MICROCONTROLLER

(75) Inventors: Robert Allan Faust, Austin, TX (US); John Daniel Upton, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 460 days.

(21) Appl. No.: 10/671,060

(22) Filed: Sep. 25, 2003

(65) Prior Publication Data

US 2005/0071719 A1    Mar. 31, 2005

(51) Int. Cl.
G01R 31/28    (2006.01)
(52) U.S. Cl. .................. 714/727; 714/729
(58) Field of Classification Search .............. 716/4, 716/1; 714/726, 30, 727, 729
See application file for complete search history.

(56) References Cited

U.S. PATENT DOCUMENTS

| | | | |
|---|---|---|---|
| 5,331,571 A * | 7/1994 | Aronoff et al. | 716/4 |
| 5,590,354 A | 12/1996 | Klapproth | |
| 5,819,025 A | 10/1998 | Williams | |
| 6,131,174 A | 10/2000 | Fischer | |
| 6,151,657 A | 11/2000 | Sun | |
| 6,163,824 A | 12/2000 | Quackenbush | |
| 6,185,522 B1 | 2/2001 | Bakker | |
| 6,185,523 B1 | 2/2001 | Itskin | |
| 6,185,732 B1 | 2/2001 | Mann | |
| 6,363,501 B1 | 3/2002 | Tobias | |
| 6,490,638 B1 | 12/2002 | Ha | |
| 6,493,788 B1 | 12/2002 | Sun | |
| 6,522,985 B1 | 2/2003 | Swoboda | |
| 6,704,895 B1 * | 3/2004 | Swoboda et al. | 714/726 |
| 6,715,132 B1 * | 3/2004 | Bartz et al. | 716/1 |
| 6,928,586 B1 * | 8/2005 | Tobias et al. | 714/30 |
| 6,954,879 B1 * | 10/2005 | Tobias et al. | 714/30 |

FOREIGN PATENT DOCUMENTS

| | | | |
|---|---|---|---|
| EP | 0 462 328 A1 * | 12/1991 | |
| EP | 1 205 848 A1 * | 5/2002 | |
| JP | 200124225 | 9/2001 | |
| JP | 2000148528 | 7/2002 | |

* cited by examiner

*Primary Examiner*—David Ton
(74) *Attorney, Agent, or Firm*—John McBurney; Jack Musgrove

(57) ABSTRACT

A method of accessing an embedded microcontroller, by programmably selecting pins of the microcontroller for use as test lines, receiving a scan command at an input test line pin, emulating a virtual scan path through a logical block of the microcontroller, and transmitting scan results to an output test line pin. The microcontroller can provide such emulation of scan testing in compliance with the JTAG standard for a test access port and boundary-scan architecture. The test line pins are interconnected with a test bus structure to form a scan ring with other components of a data processing system, such as a microprocessor. The emulation can be used to change a functional mode of the microcontroller, or gather diagnostic information after a system error. The microcontroller assigns a high-priority internal interrupt routine to service test line pin activity. The virtual scan path need not include all internal microcontroller resources, and the scan path can be programmably varied by the application designer.

23 Claims, 4 Drawing Sheets

METHOD AND APPARATUS FOR DIAGNOSIS AND BEHAVIOR MODIFICATION OF AN EMBEDDED MICROCONTROLLER

BACKGROUND OF THE INVENTION

1. Field of the Invention

The present invention generally relates to data processing systems and logic devices, and more particularly to a method of implementing diagnostic and functional modes in a microcontroller embedded in a data processing system.

2. Description of the Related Art

Integrated circuits are used in a wide variety of products, and most of these circuits, such as microprocessors, adapter chips, etc., have complicated logic designs. These designs are buried deep in the microchip layers and can be difficult to test. A generalized integrated circuit is shown in FIG. 1. Circuit 10 includes several logic function circuits 12, 14, 16, and 18 and several flip-flops, or latches, 20, 22, 24, 26, and 28. The logic functions have various inputs, and their outputs are connected to various latches; for example, logic function 12 has four outputs respectively connected to latches 20–26. Each logic function has many logic components (gates, inverters, etc.) arranged to provide a particular function, such as an adder or execution unit. The latches store data, and may provide inputs to other logic functions, such as latches 20 and 24 which are connected to logic function 16. Circuit 10 may have one or more latches such as 28, which provides the output of the circuit. A clock signal 30 provides synchronization (control) for the latches and logic units. The clock may be a primary input to the circuit or internally generated.

Those skilled in the art will appreciate that, in the example of FIG. 1, the circuit is greatly simplified since there are many more logic functions and latches in a typical integrated circuit, the logic functions can further be very complicated, and more than one clock signal can be provided. This figure is still adequate, however, for understanding how testing of the circuit can be performed. One method involves the use of test patterns which are fed into the primary inputs of the circuit while the output is examined. This approach is limited by the structure of the logic design and may fail to catch unusual flaws in a particular design.

Another testing technique is to provide a mechanism for setting the latches to predefined states using special lines which are provided on the microchip, such as scan line 32 which is connected directly to latch 20, and scan line 34 which directly interconnects latch 20 with latch 28 (other scan lines, not shown, can be provided for other latches, depending upon the type of scan implementation). Separate control can be provided for scanning the latches, using a test clock 36. A scan output line 38 may also be provided. Conventional scan designs include the multiplexed D Flip-Flop scan design, and IBM's Level Sensitive Scan Design (LSSD).

One accepted standard for scan testing is the Institute of Electronic and Electrical Engineers (IEEE) standard 1149.1 for a test access port and boundary-scan architecture. This standard was created by the Joint Test Action Group and is referred to as the JTAG interface. JTAG interfaces are commonly provided in integrated circuit systems. IEEE standard 1149.1 allows test instructions and data to be serially loaded into a device and enables the subsequent test results to be serially read out. JTAG interfaces are provided to allow designers to efficiently access internal parameters of integrated circuits, to perform a boundary scan test on an integrated circuit (IC) device, or to detect faults in the IC.

Every IEEE standard 1149.1-compatible device includes an interface having four additional pins—two for control and one each for input and output serial test data. To be compatible, a component must have certain basic test features, but IEEE standard 1149.1 allows designers to add test features to meet their own unique requirements. An exemplary implementation of a JTAG interface is illustrated in FIG. 2. Lines TDI and TDO are the test data input and output ports, respectively. Line TMS is the test mode select signal. Line TCK is the test clock, and line TRST is used for a reset signal.

The term "boundary-scan" derives from the concept of scanning information into and out of a block of circuitry by interfacing to its "boundary." The "boundary" of such circuitry consists of input/output (I/O) cells. Each boundary I/O cell is accessed via a special circuit called a boundary-scan cell (BSC). The BSCs are connected in a serial scan path called the boundary-scan register (BSR). Other scan paths exist, such as a one-bit long bypass register, an instruction register and, optionally, one or more user-defined data registers. All scan paths begin with the TDI pin and end with TDO pin.

The JTAG interface is operated by applying clock pulses on TCK and control signals on TMS, while data is input on TDI and exits from TDO. Internally, the test access port (TAP) state engine is used to control the JTAG interface. The TAP is controlled by signaling on the TMS line. Basically, the TAP can perform "capture" and "update" functions, and select which register is to be used. The capture function samples I/O data to be shifted out of the BSR or status, if the instruction register is selected. One of a number of user-defined data registers can be selected instead of the BSR, by updating the instruction register with the appropriate operational code. The update function latches data into the BSR, data, or instruction register. The data is that which was previously scanned into the selected register. In the case of the BSR, the update at the inputs transfers data as if it came from input pins, and at the outputs it transfers data to the output pins.

One type of integrated circuit that is particularly useful in data processing systems is a microcontroller. Microcontrollers are similar to microprocessors used in conventional computers, but are independently programmable and can have a great deal of additional functionality combined on the same integrated circuit (chip). In a typical computer, the microprocessor performs the primary or basic computing functions, and other integrated circuits such as memory, adapters, etc., provide peripheral functions such as communications, input/output (I/O), and controlling devices such as monitors or printers. In a conventional microcontroller, many of these functions are contained within the chip itself. A typical microcontroller might have a core microprocessor, a memory controller, an interrupt controller, and both asynchronous and synchronous serial interfaces.

Microcontrollers are routinely used as replacements for random discrete logic or small gate arrays. This approach has become extremely common due to the considerable cost advantages. While microcontrollers are programmable computing devices in their own right, in such "embedded" applications they perform a specific dedicated function, to behave like the logic they replace. Debugging the programming code in embedded microcontrollers is usually done during development using an in-circuit emulator (ICE) unit. Oftentimes, however, problems arise after the microcontroller is installed as part of the larger system. Following deployment of the system using these embedded devices, diagnosing faulty operation usually requires reattachment of an ICE device to gather pertinent internal debug data. In addition, in the event of a system error (not caused by the microcontroller itself), there is normally no way to gather useful system diagnostic data that may reside within the microcontroller. Such data as the state of the device may be very useful in diagnosing the original cause of the system error.

Some manufacturers of microcontrollers offer devices which incorporate a hardware JTAG test bus (see, e.g., U.S. Pat. Nos. 5,590,354 and 6,363,501). This bus is used for in-circuit emulation functions, as a programming port for the microcontroller, and for device testing in a manufacturing environment. Testing involves the exercising of the JTAG bus to test for and diagnose component and card (wiring) faults. However, even with hardware JTAG support, the microcontroller's actual operation (i.e., the user-defined embedded firmware) cannot be functionally tested. Testing instead is limited to certain hardware and input/output fixed by the JTAG interface. For these devices, there is no ready provision for flexible use of the JTAG hardware during normal operation of the microcontroller.

It would, therefore, be desirable to devise an improved method for easily debugging and diagnosing microcontrollers when used as a replacement for discrete logic. It would be further advantageous if the method could gather detailed diagnostic information from embedded microcontrollers upon detection of system error conditions.

SUMMARY OF THE INVENTION

It is therefore one object of the present invention to provide an improved method of diagnosing microcontrollers.

It is another object of the present invention to provide such a method which may be implemented while using the microcontroller in an embedded application, during run-time operation.

It is yet another object of the present invention to provide such a method which can further be utilized to send commands to a microcontroller at run-time to change the current mode of operation of the microcontroller.

The foregoing objects are achieved in a method of providing communications for an embedded microcontroller, generally comprising the steps of:

1. programmably selecting several pins of the microcontroller for use as test lines;
2. receiving a scan command at an input test line pin;
3. emulating a virtual scan path with software that is embedded in the controller along with the controller's main application, which can either access or alter such status information as software and/or hardware states including the state of one or more of the controller's registers; and
4. transmitting scan results to an output test line pin.

In particular the invention provides for the microcontroller emulation of such scan testing in compliance with IEEE standard 1149.1 for a test access port and boundary-scan architecture. The test line pins are interconnected with a test bus structure to form a scan ring with other components of a data processing system, such as a microprocessor, gate array logic, discrete logic, or another microcontroller. The emulation can be used to change a functional mode of the microcontroller, or gather diagnostic information after a system error. The microcontroller assigns a high-priority internal interrupt routine to service test line pin activity. The virtual scan path need not include all internal microcontroller resources, and the scan path can be programmably varied by the application designer.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
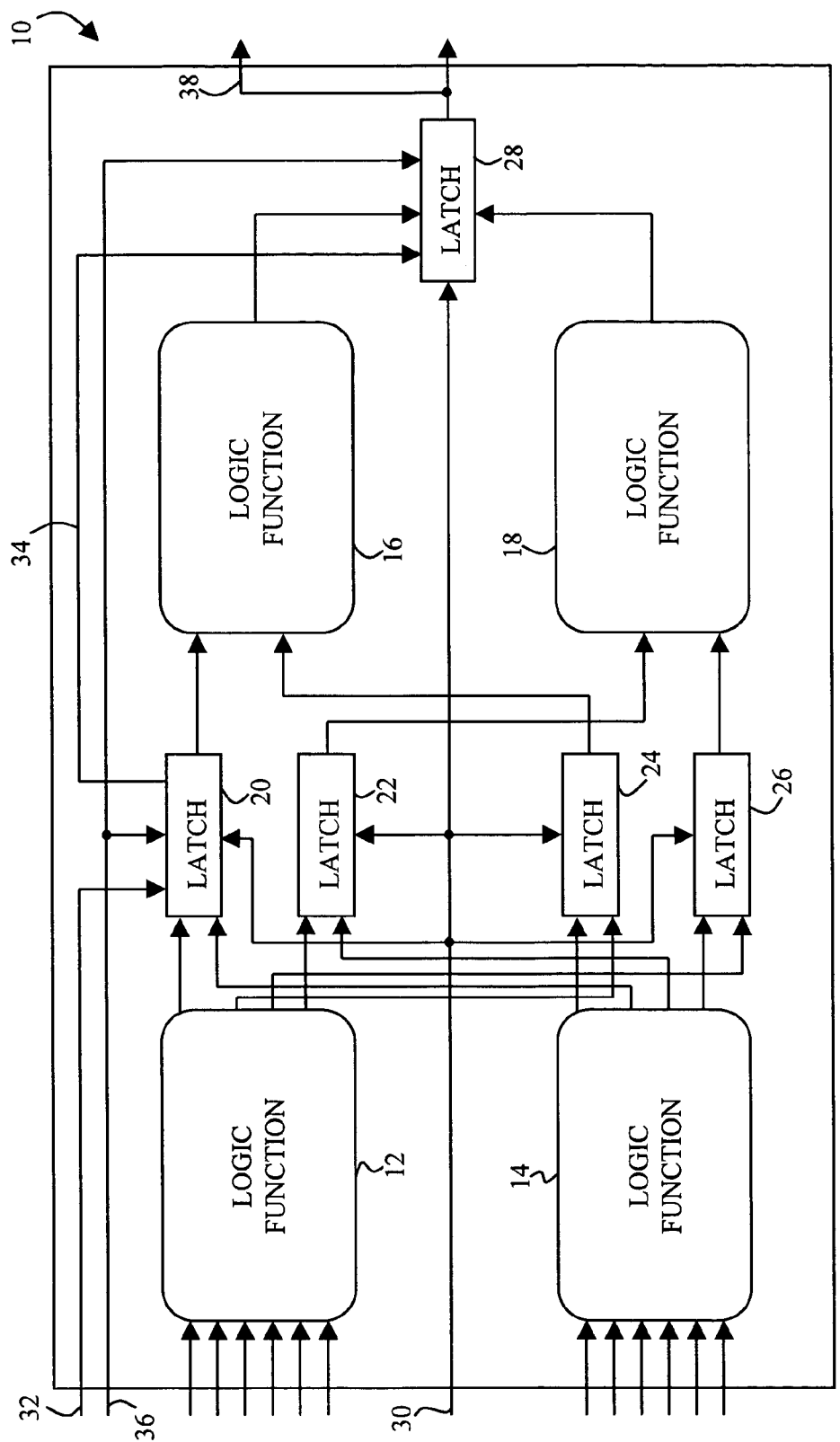
FIG. 1 is a high-level schematic diagram of a generalized conventional integrated circuit having various logic functions and registers, and scan paths which are used to test the integrated circuit by setting or examining the states of the registers.
Figure 2:
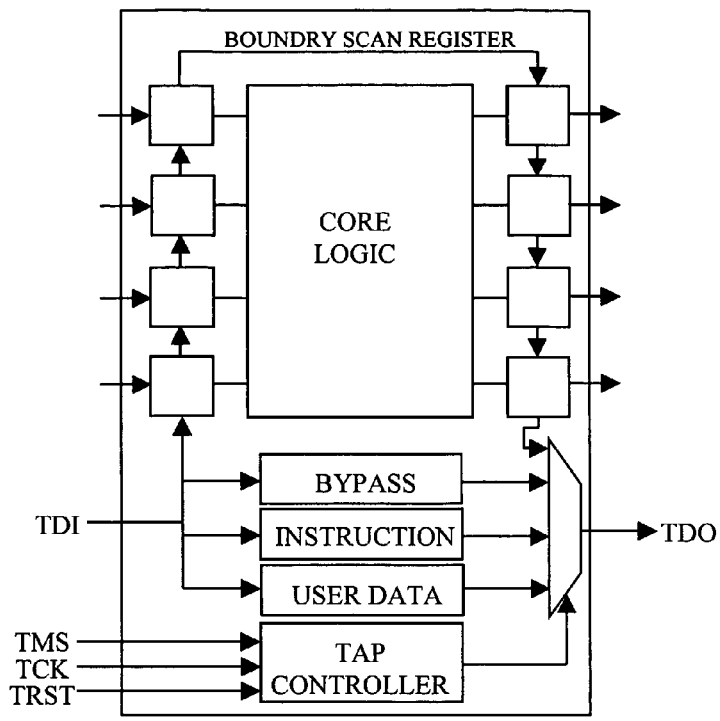
FIG. 2 is a simplified schematic diagram illustrating a prior art boundary scan standard interface referred to as the JTAG test bus.
Figure 3:
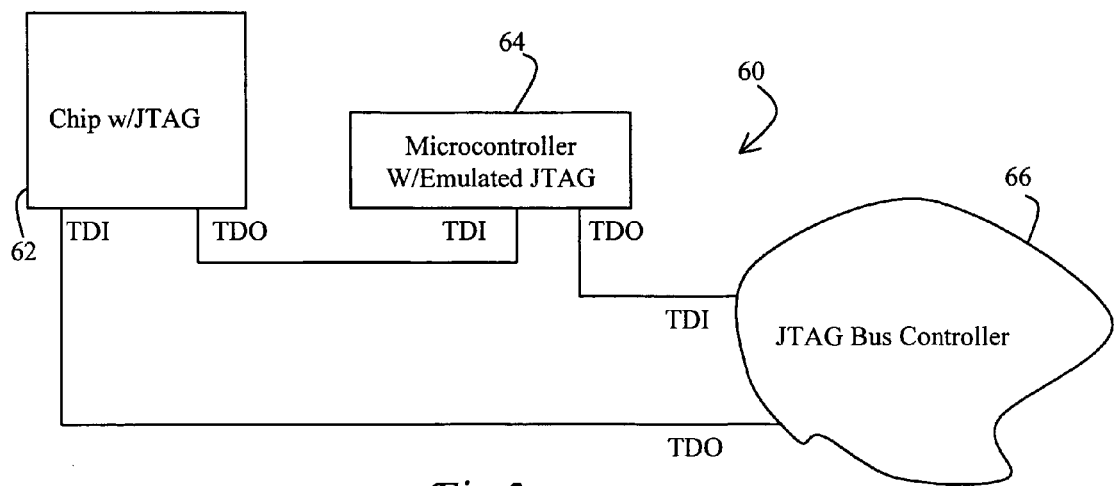
FIG. 3 is a block diagram of one embodiment of a data processing system constructed in accordance with the present invention, wherein an embedded microcontroller emulates a JTAG interface during run-time operation.

With reference now to the figures, and in particular with reference to FIG. 3, there is depicted one embodiment 60 of a data processing system constructed in accordance with the present invention. Data processing system 60 is generally comprised of a microprocessor chip 62, a microcontroller 64, and a JTAG bus controller 66. In this example, data processing system 60 is somewhat simplified to facilitate understanding of the invention. Those skilled in the art will appreciate that data processing system 60 may include many other components, such as adapter cards, memory units, and application-specific controllers, as well as additional microprocessors or microcontrollers, depending upon the particular application.

Microcontroller 64 is "embedded," i.e., it has appropriate firmware instructions to carry out a specific dedicated function, and serves as a replacement for more expensive custom logic devices, such as adapter cards or peripheral device controllers. For example, microcontroller 64 may operate as a controller for a permanent storage device (hard disk drive). Through the embedded user-defined firmware, the microcontroller takes on all the attributes of fully testable discrete logic which it is meant to emulate and replace. Many different available components can be adapted for use in accordance with the present invention; in the illustrative embodiment, chip 62 is the PowerPC™ microprocessor sold by International Business Machines Corp. (IBM—assignee of the present invention), microcontroller 64 is the 80C51 sold by Intel Corp., and bus controller 66 is the service processor as implemented in the pSeries servers sold by IBM.

Chip 62, microcontroller 64 and bus controller 66 together form a scan ring for testing and access in accordance with IEEE standard 1149.1 for a test access port and boundary-scan architecture (the JTAG interface). A first data line is connected from the test data out (TDO) port of bus controller 66 to the test data in (TDI) port of chip 62. A second data line is connected from the TDO port of chip 62 to the TDI port of microcontroller 64. A third data line is connected from the TDO port of microcontroller 64 to the TDI port of bus controller 66. Additional lines (not shown), such as TMS and TCK lines, are routed directly to each component. These interconnections are formed on the printed circuit board substrate (motherboard) which supports the various integrated circuits in data processing system 60. The scan protocol prescribed by IEEE standard 1149.1 is used for communications along these data lines.

While microcontroller 64 may optionally have a hardware JTAG interface (as does PowerPC microprocessor 62), this feature is not necessary. Rather, the present invention provides a "virtual" JTAG interface within the embedded microcontroller, i.e., the microcontroller firmware is programmed to emulate this virtual JTAG port. In addition to its normal emulation code for performing the particular logic replacement function, microcontroller 64 contains instructions to emulate the JTAG test bus on at least four of its pins. These pins are then connected into the JTAG test bus structure of application system 60. In other words, the TDI and TDO ports of microcontroller 64 shown in FIG. 3 (and in FIGS. 4A–4B) are not part of any hardware JTAG interface, but rather are provided using two of the programmable pins of microcontroller 64. A high-priority internal interrupt routine is assigned to service JTAG interface pin activity. All JTAG interfacing is handled by "bit-banging" the input/output (I/O) pins assigned to the JTAG interface.

Bit-banging is a method of digital signaling where the 1's and 0's are sensed and/or set directly by processor instructions. For example, the pseudo instructions "Lower Pin1, Raise Pin1, Lower Pin1" bit-bangs a voltage pulse out on Pin1. An instruction "Input Pin2" would sense the voltage at Pin2 as a "1" or "0" depending on the voltage level at Pin2, and this value would be used in further program instructions. Bit-banging contrasts with signals being received and/or sent by a block of hardware logic. The logic block is given commands by a processor and then it conducts the detailed sensing and emitting without further involvement of processor. One disadvantage of bit-banging is that it can be slower and processor intensive. However, a major advantage is that new functionality can be added at any time via programming whereas hardware logic functionality remains frozen until the silicon is redesigned. Programmers can thus not only use bit-banging to incorporate a virtual JTAG into a microcontroller, but can further impart additional JTAG functionality to their product at any time with a simple software change. This advantage is not available with prior art JTAG functions which are imbedded in a chip's hardware.

As an active participant in the JTAG chain structure, microcontroller 64 is able to provide complete access to all the registers, buffers, and functions of the primary logic it emulates. The present invention thus allows any microcontroller to easily implement a JTAG test bus, with no artificial constraints on the JTAG functions to be provided. The JTAG bus may now be used to scan initialization data into microcontroller 64 at system power-on time, change functional modes of microcontroller 64 during normal system operation, provide real-time debug and trace data, and dump all virtual register and buffer contents during system error scan-out for more thorough error capture diagnostics by a service processor (the scan ring dump of the system state can be saved for later analysis or inspected on the fly to determine the cause of the error). The microcontroller's JTAG scan responses may now be made to exactly mimic the logic which the controller is replacing, through emulation. These capabilities are provided via the virtual JTAG interface even if the microcontroller has separate hardware JTAG support.

For example, microcontroller 64 may emulate a simple real-time clock component. Rather than having the device respond to JTAG scans by dumping its complete internal state (including all RAM, EPROM, ALU, registers, etc.), it instead responds by scanning out only its I/O pin states and the contents of its time-keeping registers which are defined as a small number of RAM locations in its internal program. Though microcontroller 64 may have hundreds or thousands of bytes of internal RAM and flash EPROM, it only scans out the data appropriate to the logic function it emulates, which is possible since the JTAG interface is totally under firmware control within the device. To all external appearances, the device is a real-time clock circuit and functionally behaves like one, and its run-time JTAG scan strings reflect only that embedded function.

The present invention advantageously allows additional JTAG functions not foreseen during the original implementation of a product to be added later through a simple software change. Furthermore, there might be cases wherein certain JTAG functions are desired in the lab during product "bring-up and debug" but which are preferably omitted from the final consumer product. The present invention uniquely adds extreme flexibility to the virtual JTAG design process.

Moreover, commands can now be sent to microcontroller 64 at run-time over the virtual JTAG test bus. If the microcontroller is used on a JTAG scan chain as a single device, special run-time options become available. These commands could be used to change the current mode of operation, request real-time debugging or trace data, or monitor internal operations. In this manner, the virtual JTAG interface becomes a side-band communication path to the logic represented by the microcontroller.

Figure 4A:
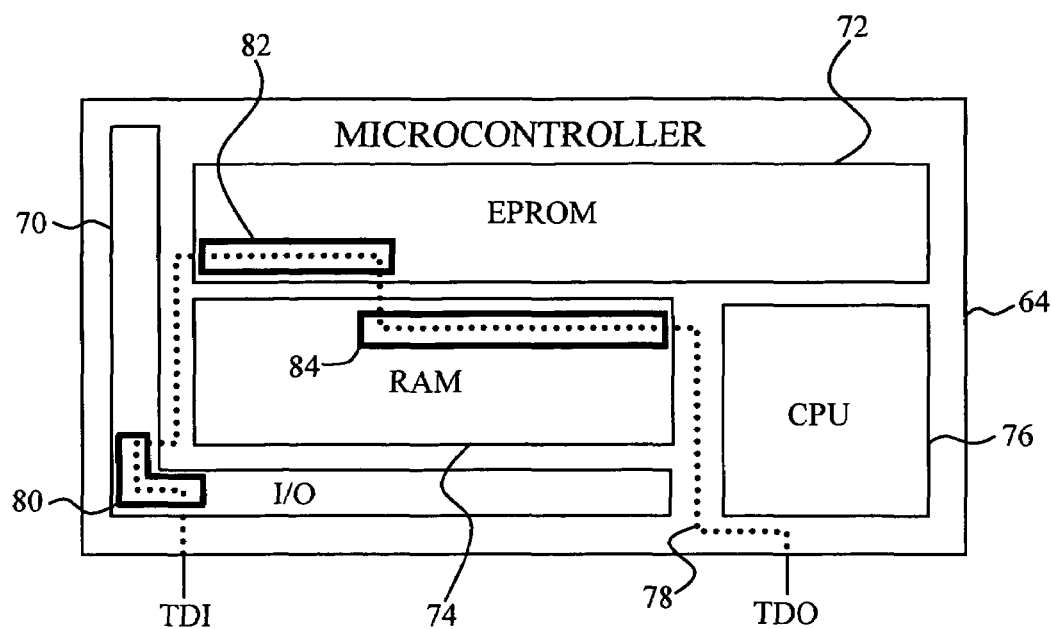
FIGS. 4A and 4B are block diagrams illustrating alternative virtual scan paths which pass through the same microcontroller, in accordance with one implementation of the present invention.
Figure 4B:
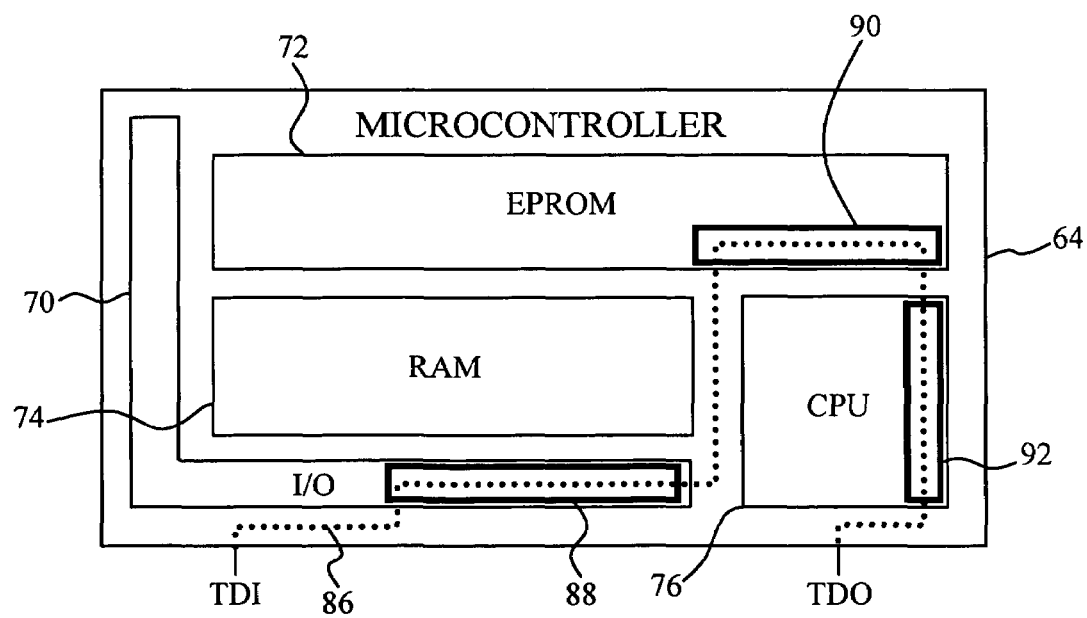

Additional advantages arise from the present invention with regard to the scan paths within the emulated logic device. As illustrated in FIGS. 4A and 4B, the virtual internal scan ring of the device need not include all internal microcontroller resources in the scan ring; moreover, the scan path can be programmably varied. The variable scan path is made possible because the scan ring is actually emulated by code totally under the application designer's control. Even different pins can be programmably selected for use as a particular test line, e.g., the TDO line.

In FIG. 4A, a simplified structure is shown for microcontroller 64 which includes four logic blocks or cells: an I/O block 70, an erasable, programmable read-only memory (EPROM) block 72, a random-access memory (RAM) block 74, and a central processing unit (CPU) block 76. A first virtual scan path 78 is designed which traverses a portion 80 of I/O block 70, a portion 82 of EPROM block 72, and a portion 84 of RAM block 74. The first virtual scan path 78 does not include any of the contents of CPU block 76. The scan command is received at pin TDI and the scan results are transmitted at pin TDO.

In FIG. 4B, the firmware of microcontroller 64 has altered the scan emulation code to present a second virtual scan path 86 which traverses a different portion 88 of I/O block 70, a different portion 90 of EPROM block 72, and a portion 92 of CPU block 76. The second virtual scan path 86 does not include any of the contents of RAM block 74. These scan paths are examples and are not meant to be limiting; the system designer can select whatever registers are desired for any particular diagnosis or behavior modification of the embedded microcontroller. Since they are virtual, a scan path can even be non-continuous relative to the physical topology of the chip.

Figure 5:
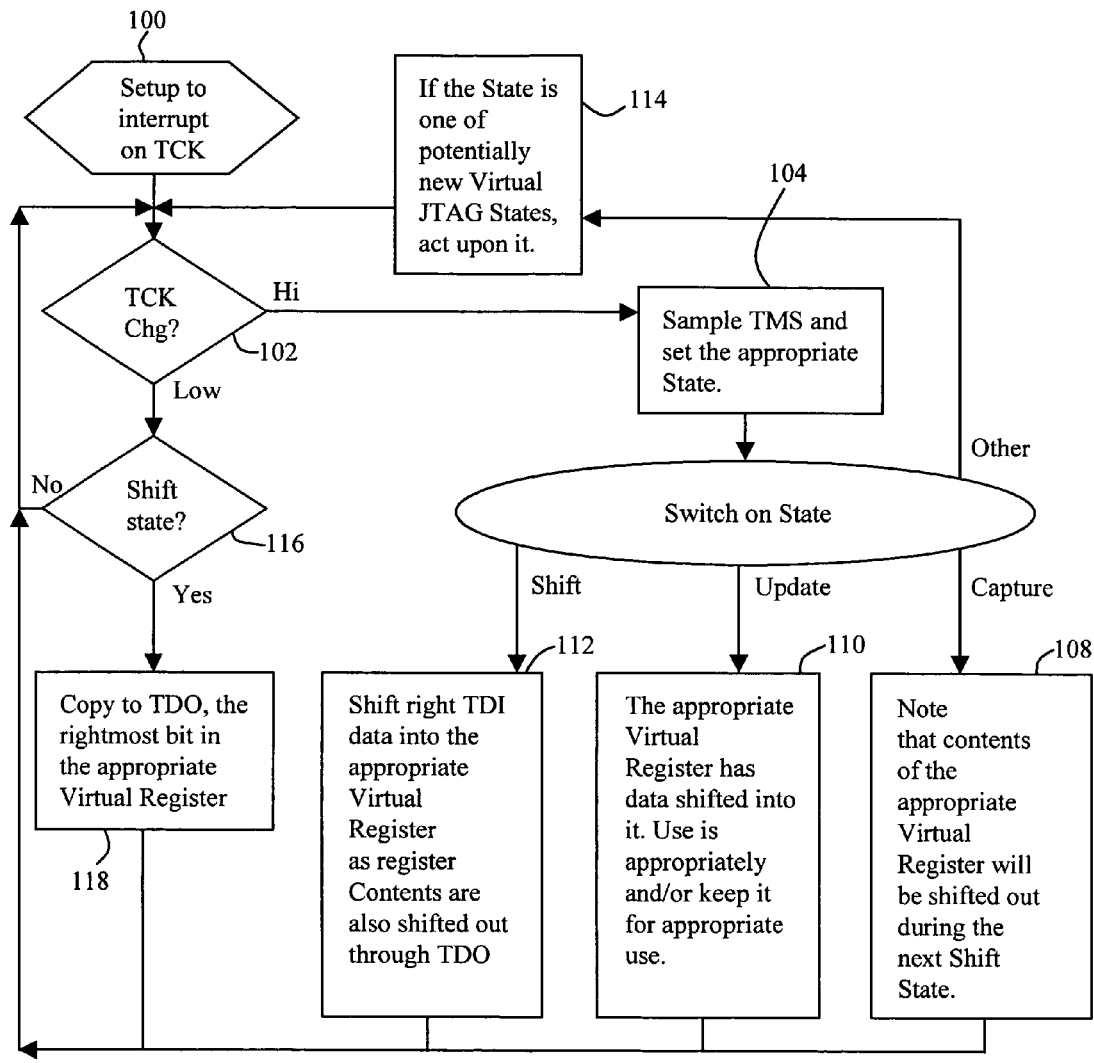
FIG. 5 is a chart illustrating the logical flow of program code provided for the embedded microcontroller to emulate the JTAG interface, according to one embodiment of the present invention.

The present invention may be further understood with reference to FIG. 5, which illustrates an example of the logical flow for the microcontroller firmware code in emulating the JTAG interface. The process begins by setting up the system to allow detection of an interrupt on the TCK line (100). When a change in the TCK signal is detected, it is examined to determine its value, low or high (102). If the value is high, the TMS line is sampled to set the appropriate test state, e.g., capture, update, shift, or some other user-defined function (104). The test state is then used to branch out to those various functions (106). If the capture function is selected, a flag is set to indicate that the contents of the appropriate virtual register are to be shifted out during the next shift state (108). Virtual instruction and bypass registers are maintained by the virtual JTAG software, as well as one or more programmably-selected virtual data registers. If the update function is selected, the particular virtual register indicated contains shifted data which may be used or retained according to the test parameters (110). If the shift function is selected, the rightmost bit of the TDI signal is shifted into the particular virtual register indicated as other register contents are also shifted out through the TDI line (112). If the test state indicates that some other user-defined function is selected, then the firmware carries out that particular function, e.g., an operational mode change (114). After completion of the selected function, the process iterates at step 102.

Returning to step 102 in the process, if the TCK signal is low, the shift flag is examined to determined whether a shift is due (116). If not, the system waits for the next clock tick. If so, the rightmost bit in the appropriate virtual register is copied to TDO (118), and the process again iterates at step 102.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of communicating with an embedded microcontroller in a data processing system, comprising:
   programmably selecting a plurality of pins of the microcontroller for use as test lines;
   receiving a scan command at a first one of the test line pins of the microcontroller;
   emulating a virtual scan path through a portion of at least one logical block of the microcontroller with software that is embedded in the microcontroller to access one or more registers in the logical block, in response to said receiving step; and
   transmitting scan results at a second one of the test line pins of the microcontroller.

2. The method of claim 1 wherein said emulating step accesses the one or more registers to thereby change a functional mode of the microcontroller.

3. The method of claim 1 wherein said emulating step accesses the one or more registers to thereby gather diagnostic information.

4. The method of claim 1 wherein said receiving, emulating, and transmitting steps are compliant with IEEE standard 1149.1 for a test access port and boundary-scan architecture.

5. The method of claim 1 wherein the microcontroller assigns a high-priority internal interrupt routine to service test line pin activity.

6. The method of claim 1, further comprising the step of interconnecting said first and second test line pins with a test bus structure to form a scan ring.

7. A microcontroller comprising:
   input/output pins;
   a plurality of logical blocks operatively interconnected to said input/output pins;
   a memory device; and
   firmware instructions stored in said memory device for programmably selecting a plurality of said input/output pins for use as test lines, receiving a scan command at a first one of said test line pins, emulating a virtual scan path through a portion of at least one of said logical blocks to access one or more registers in said at least one logical block, and transmitting scan results at a second one of said test line pins.

8. The microcontroller of claim 7 wherein said firmware instructions emulate the virtual scan path to access said one or more registers and thereby change a functional mode of the microcontroller.

9. The microcontroller of claim 7 wherein said firmware instructions emulate the virtual scan path to access said one or more registers and thereby gather diagnostic information.

10. The microcontroller of claim 7 wherein said firmware instructions receive the scan command, emulate the virtual scan path, and transmit the scan results in compliance with IEEE standard 1149.1 for a test access port and boundary-scan architecture.

11. The microcontroller of claim 7 wherein said firmware instructions assign a high-priority internal interrupt routine to service test line pin activity.

12. The microcontroller of claim 7 further comprising a hardware JTAG interface.

13. A data processing system comprising:
    at least one processor; and
    at least one embedded microcontroller interconnected with said processor, said microcontroller having input/output pins, a plurality of logical blocks operatively interconnected to said input/output pins, a memory device, and firmware instructions stored in said memory device for emulating a dedicated logic function, said firmware instructions further programmably selecting a plurality of said input/output pins for use as test lines, receiving a scan command at a first one of said test line pins, emulating a virtual scan path through a portion of at least one of said logical blocks with software that is embedded in said microcontroller to access one or more registers in said at least one logical block, and transmitting scan results at a second one of said test line pins, while emulating the dedicated logic function.

14. The data processing system of claim 13 wherein said firmware instructions emulate the virtual scan path to access said one or more registers and thereby change a functional mode of said microcontroller.

15. The data processing system of claim 13 wherein said firmware instructions emulate the virtual scan path to access said one or more registers and thereby gather diagnostic information.

16. The data processing system of claim 13 wherein said firmware instructions receive the scan command, emulate the virtual scan path, and transmit the scan results in compliance with IEEE standard 1149.1 for a test access port and boundary-scan architecture.

17. The data processing system of claim 13 wherein said firmware instructions assign a high-priority internal interrupt routine to service test line pin activity.

18. The data processing system of claim 13 wherein said first and second test line pins are interconnected with a test bus structure to form a scan ring which includes said processor.

19. A computer program product comprising:
   a storage medium adapted to be read by a microcontroller; and
   program means stored on said storage medium for programmably selecting a plurality of pins of the microcontroller for use as test lines, receiving a scan command at a first one of the test line pins of the microcontroller, emulating a virtual scan path through a portion of at least one logical block of the microcontroller to access one or more registers in the logical block in response to said receiving of the scan command, and transmitting scan results at a second one of the test line pins of the microcontroller.

20. The computer program product of claim 19 wherein said program instructions further access the one or more registers to thereby change a functional mode of the microcontroller.

21. The computer program product of claim 19 wherein said program instructions further access the one or more registers to thereby gather diagnostic information.

22. The computer program product of claim 19 wherein said program instructions perform said receiving, emulating, and transmitting in compliance with IEEE standard 1149.1 for a test access port and boundary-scan architecture.

23. The computer program product of claim 19 wherein said program instructions further assign a high-priority internal interrupt routine to service test line pin activity.

* * * * *